United States Patent
Ditto et al.

(10) Patent No.: US 8,436,637 B1
(45) Date of Patent: May 7, 2013

(54) NOISE-ASSISTED REPROGRAMMABLE NANOMECHANICAL LOGIC GATE AND METHOD

(75) Inventors: William L. Ditto, Tempe, AZ (US); Pritiraj Mohanty, Boston, MA (US); Sudeshna Sinha, Mohali (IN); Ardeshir R. Bulsara, San Diego, CA (US); Diego N. Guerra, Boston, MA (US); Krishnamurthy Murali, Chennai (IN)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 31 days.

(21) Appl. No.: 13/043,733

(22) Filed: Mar. 9, 2011

Related U.S. Application Data

(60) Provisional application No. 61/314,117, filed on Mar. 15, 2010.

(51) Int. Cl.
*H03K 19/175* (2011.01)
(52) U.S. Cl.
USPC .......................................................... 326/7
(58) Field of Classification Search .............. 326/37–47, 326/101, 1–7
See application file for complete search history.

(56) References Cited

U.S. PATENT DOCUMENTS

| | | | | |
|---|---|---|---|---|
| 6,008,564 | A * | 12/1999 | Takayoshi et al. | 310/318 |
| 2004/0175174 | A1* | 9/2004 | Suhami | 398/43 |
| 2008/0071487 | A1* | 3/2008 | Zeng et al. | 702/65 |
| 2010/0219914 | A1* | 9/2010 | Sadek et al. | 333/197 |

OTHER PUBLICATIONS

Guerra, D.N.; Bulsara, A.R.; Ditto, W.L.; Sinha, S.; Murali, K.; Mohanty, P.; "A Noise-Assisted Reprogrammable Nanomechanical Logic Gate", Nanoletters, American Chemical Society, Mar. 10, 2010; 1168-1171.
Gibbs, W.; "A Split at the Core"; Sci. Am. 2004, 291 (November), 96-101.
Bennett, C. H.; Landauer, R.; "The Fundamental Physical Limits of Computation"; Sci. Am. 1985, 253 (July), 48-53.
Blick, R. H.; Qin, H.; Kim, H. S.; Marsland, R.; "A Nanomechanical Computer—Exploring New Avenues of Computing"; New J. Phys. 2007, 9, 241.
Masmanidis, S. C.; Karabalin, R. B.; De Vlaminck, L; Borghs, G.; Freeman, M. R.; Roukes, M. L.; "Multifunctional Nanomechanical Systems via Tunably Coupled Piezoelectric Actuation"; Science 2007, 317, 5889.
Mahboob, I.; Yamaguchi, H.; "Bit storage and bit flip operations in an electromechanical oscillator"; Nat. Nanotechnol. 2008, 3, 275.

(Continued)

*Primary Examiner* — Thienvu Tran
(74) *Attorney, Agent, or Firm* — Kyle Eppele; Stephen E. Baldwin

(57) ABSTRACT

A nanomechanical device, operating as a reprogrammable logic gate, and performing fundamental logic functions such as AND/OR and NAND/NOR. The logic function can be programmed (e.g., from AND to OR) dynamically, by adjusting the operating parameters of the resonator. The device can access one of two stable steady states, according to a specific logic function; this operation is mediated by the noise floor which can be directly adjusted, or dynamically tuned via an adjustment of the underlying nonlinearity of the resonator, i.e., it is not necessary to have direct control over the noise floor. The demonstration of this reprogrammable nanomechanical logic gate affords a path to the practical realization of a new generation of mechanical computers.

3 Claims, 4 Drawing Sheets

OTHER PUBLICATIONS

Bulsara, A.; Gammaitoni, L.; "Tuning in to Noise"; Phys. Today 1996, 49 (3), 39.

Gammaitoni, L.; Hanggi, P.; Jung, P.; Marchesoni, F.; "Stochastic Resonance"; Rev. Mod. Phys. 1998, 70, 223-287.

Badzey, R. L.; Mohanty, P.: "Coherent signal amplification in bistable nanomechanical oscillators by stochastic resonance"; Nature 2005, 437, 995-998.

Almog, R.; Zaitsev, S.; Shtempluck, O.; Buks, E.; "Signal amplification in a nanomechanical Duffing resonator via stochastic resonance"; Appl. Phys. Lett. 2007, 90, 013508.

Guerra, D. N.; Dunn, T.; Mohanty, P.; "Signal Amplification by 1/f Noise in Silicon-Based Nanomechanical Resonators"; Nano Lett. 2009, 9 (9), 3096.

Murali, K.; Sinha, S.; Ditto, W. L.; Bulsara, A. R.; "Reliable Logic Circuit Elements that Exploit Nonlinearity in the Presence of a Noise Floor"; Phys. Rev. Lett. 2009, 102, 104101.

Guerra, D. N.; Imboden, M.; Mohanty, P.; "Electrostatically actuated silicon-based nanomechanical switch at room temperature"; Appl. Phys. Lett. 2008, 93, 033515.

Badzey, R. L.; Zolfagharkhani, G.; Gairdazhy, A.; Mohanty, P.; "A controllable nanomechanical memory element"; Appl. Phys. Lett. 2004, 85, 3587.

Kaajakari, V.; Koskinen, J. K.; Mattila, T.; "Phase Noise in Capacitively Coupled Micromechanical Oscillators"; IEEE Trans. Ultrason.Ferroelectr. Freq. Control 2005, 52, 2322.

Nayfeh, A. H.; Mook, D. T.; "Forced Oscillations of Systems Having a Single Degree of Freedom"; Nonlinear Oscillations, Chapter 4; Wiley: New York, 1979; pp. 161-174.

Inchiosa, M.; Bulsara, A.; Hibbs, A.; Whitecotton, B.; "Signal Enhancement in a Nonlinear Transfer Characteristic"; Phys. Rev. Lett. 1998, 80, 1381.

Landauer, R.; "Irreversibility and Heat Generation in the Computing Process"; IBM J. Res. Dev. 1961, 5, 183.

Shizume, K.; "Heat generation required by information erasure"; Phys. Rev. 1995, E 52, 3495.

Aldridge, J. S.; Cleland, A.N.; "Noise-Enable Precision Measurements of a Duffing Nanomechanical Resonator"; Phys. Rev. Lett. 2005, 94, 156403.

Sinha, S.; Munakata, T.; Ditto, W. L.; "Flexible Parallel Implementation of Logic Gates Using Chaotic Elements"; Phys. Rev. 2002, E 65, 036216.

Fredkin, E.; Toffoli, T.; Conservative Logic; Int. J. Theor. Phys. 1982, 2.

Bulsara, A. R.; "No-nuisance Noise"; Nature 2005, 473, 962-963.

* cited by examiner

NOISE-ASSISTED REPROGRAMMABLE NANOMECHANICAL LOGIC GATE AND METHOD

CROSS-REFERENCE TO RELATED PATENT APPLICATIONS

The present application is related to U.S. provisional patent application Ser. No. 61/314,117, filed Mar. 15, 2010, entitled Noise-Assisted Reprogrammable Nanomechanical Logic Gates And Related Methods, the details of which are hereby incorporated by reference herein, and priority is claimed herein under 35 USC §119(e).

FEDERALLY-SPONSORED RESEARCH AND DEVELOPMENT

This invention (Navy Case No 101,026) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619)553-5118; email ssc pac t2@navy.milemail.

BACKGROUND OF THE INVENTION

Practical realization of a nanomechanical logic device, capable of performing fundamental logic operations, is yet to be demonstrated despite a longstanding effort towards scalable mechanical computation. Almost two centuries ago in 1822, Charles Babbage presented a mechanical computing device that he called the "Difference Engine," to the Royal Astronomical Society. Before this event, though, the search for mechanical computing devices had already been inherent to attempts to build machines capable of computation. This search has, today, taken on added urgency as we seek to exploit emerging techniques for the manipulation of matter at nanometer length scales. With Boole's ideas on logic operations with two states, an added dimension to computing, logic elements or gates, has come to dominate modern computation. However, mechanical logic, especially at the very small length scales and in the presence of a noise floor, has proven difficult to realize despite some recent experimental efforts.

SUMMARY OF THE INVENTION

In one preferred embodiment, the present invention provides a logic device comprising a resonator operating in a nonlinear frequency regime having two different vibrational steady states. A first bias means is applied to the resonator for inducing the two vibrational states with a controllable drive signal thereby creating the first and second steady states representing logic states as an output. A second bias means applies noise to the resonator and a logic signal input bias means is applied to the resonator for producing a modulation of the resonator frequency which, with the presence of the noise, induces switching between the two vibrational states and changing the logic value of the output. The logic device can further include a general logic function defined by a set of inputs and a set of outputs comprises at least one of an AND function; an OR function; a NAND function; or a NOR function. The logic device can further include a logic function wherein the logic function is dynamically programmable for the logic device.

BRIEF DESCRIPTION OF THE DRAWINGS

The invention will be more fully described in connection with the annexed drawings, where like reference numerals designate like components, in which:

FIGS. 2a and 2b show AND/NAND and OR/NOR quadrature responses, respectively, of the nanomechanical resonator of FIG. 1a.

DETAILED DESCRIPTION OF THE PREFERRED EMBODIMENTS

Figure 1:
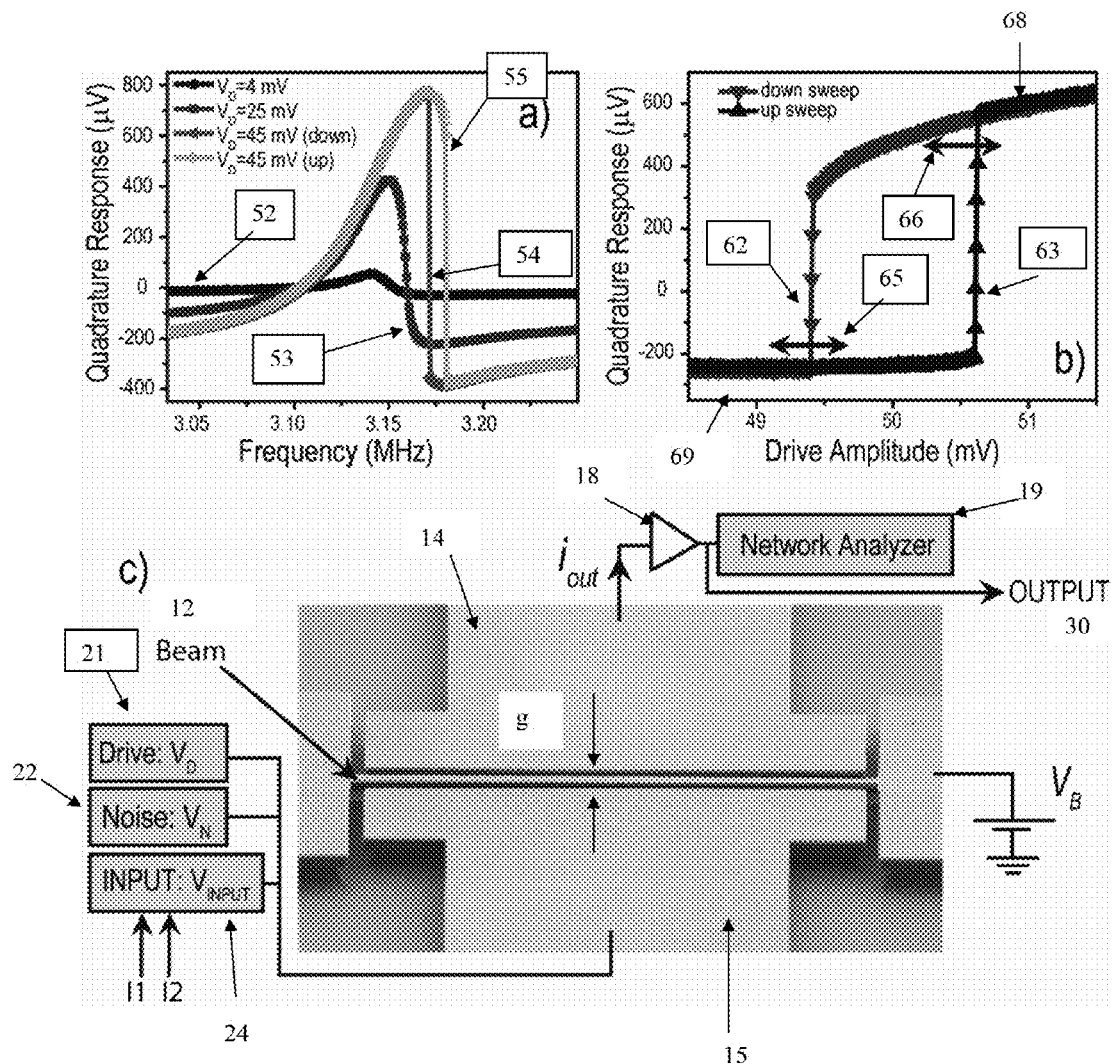
FIG. 1a shows the response in quadrature of a nanomechanical resonator of the present invention as a function of driving frequency.
FIG. 1b shows the response in quadrature of the nanomechanical resonator of FIG. 1a as a function of drive amplitude.
FIG. 1c shows a diagram of the nanomechanical resonator of the present invention.

We present a nanomechanical device, operating as a reprogrammable logic gate, performing fundamental logic functions such as AND/OR and NAND/NOR. The logic function can be programmed (e.g. from AND to OR) dynamically, by adjusting the resonator's operating parameters. The device can access one of two stable steady states, according to a specific logic function; this operation is mediated by the noise floor which can be directly adjusted, or dynamically "tuned" via an adjustment of the underlying nonlinearity of the resonator, i.e., it is not necessary to have direct control over the noise floor. The demonstration of this reprogrammable nanomechanical logic gate affords a path to a practical realization of a new generation of mechanical computers.

As described above, practical realization of a nanomechanical logic device, capable of performing fundamental logic operations, is yet to be demonstrated despite a longstanding effort towards scalable mechanical computation. Almost two centuries ago in 1822, Charles Babbage presented a mechanical computing device that he called the "Difference Engine," to the Royal Astronomical Society. Before this event, though, the search for mechanical computing devices had already been inherent to attempts to build machines capable of computation. This search has, today, taken on added urgency as we seek to exploit emerging techniques for the manipulation of matter at nanometer length scales. With Boole's ideas on logic operations with two states, an added dimension to computing, logic elements or gates, has come to dominate modern computation. However, mechanical logic, especially at the very small length scales and in the presence of a noise floor, has proven difficult to realize despite some recent experimental efforts.

Control and manipulation of mechanical response of nanometer scale can indeed be realized by exploiting a counterintuitive physical phenomenon, stochastic resonance. In a noisy nonlinear mechanical system, addition of noise can enhance the response to an external stimulus by this process. Signal amplification in such a setup has been experimentally realized in nonlinear nanomechanical resonators configured as two-state devices. Recently, it has been demonstrated that when two square waves are applied as input stimuli to a two-state system, the response can result in a specific logical output with a probability (for obtaining this output) controlled by the noise intensity. Furthermore, changing the threshold (either via adjusting the nonlinearity strength or applying a controlled asymmetrizing dc signal) can change or "morph" the system output into a different logic operation.

Our experimental logic device consists of a nanomechanical resonator 10 shown in FIG. 1c, operating in the nonlinear regime, wherein two different vibrational states 68, 69 coexist, as shown in FIG. 1b; for an underdamped system underpinned by an a priori monostable (but non-parabolic) potential energy function, these vibrational steady states are induced by biasing the system with a high-frequency (typically several MHz) controllable sinusoidal drive signal, in one embodiment.

Then, the effect of the drive signal is to tilt the potential energy function, thereby creating left and right steady states, whose (average) lifetimes depend on the interplay between the drive amplitude, damping coefficient, and the rms intensity of the system noise floor. These two states form the basis for performing binary logic by defining the logic value of the output. The logic inputs are physically implemented by two square waves of fixed level that are electrically added and applied to the resonator. These inputs produce a modulation of the resonator's frequency, which, in the presence of stochastic noise, can induce switching between the vibrational states, and hence change the logic value of the output. By varying the applied noise power an optimal window of noise is found where the output is a predefined logical function of the inputs. Furthermore, the logic function can be dynamically changed from one operation to another by adjusting the resonator's operating point; effectively, we change the drive amplitude while keeping the drive frequency constant, so that a re-optimization of the noise-floor is not necessary.

The resonator was fabricated from single-crystal silicon using standard e-beam lithography and surface nanomachining. As seen in FIG. 1c, nanomechanical resonator 10 includes a doubly clamped beam 12 with two adjacent electrodes 14, 14 used to actuate and detect the in-plane motion of the beam using standard room temperature electrostatic techniques. In one embodiment, the beam 12 is 20 μm long, 300 nm wide and 500 nm thick. The gap (g) between the beam and the electrodes is 250 nm. At room temperature, the nanomechanical beam 12 demonstrates the expected normal mode with a resonance frequency $f_0$=3.145 MHz and a quality factor Q=70 (at a pressure ~10 mTorr).

FIG. 1a shows the response in quadrature of the resonator 10 as a function of the driving frequency for different values of the drive amplitude ($V_D$). For small drive amplitudes the resonator 10 exhibits the usual Lorentzian line shape. As the drive amplitude is increased the resonance shifts towards higher frequency until the bistable regime is reached. As shown in FIG. 1a, line 52 shows $V_D$=4 mV, line 53 shows $V_D$=25 mV, line 54 shows $V_D$=45 mV (down) and line 55 shows $V_D$=45 mV (up).

FIG. 1b shows the response in quadrature of the resonator as a function of the drive amplitude for a fixed frequency (3.158 MHz) in the bistable regime. The response shows the usual hysteretic behavior when the drive amplitude is swept in different directions (increasing amplitude up triangles, decreasing amplitude down triangles).

In FIG. 1b, the horizontal arrows 62, 63 represent the effect of the input signal $V_D$. In the absence of noise this modulation is not able to produce switching between the two states 68, 69, but as noise is added switching between the two states inside the hysteretic regime becomes possible. The arrow 66 on the top right represent the NOR/OR situation while the arrow 65 on the bottom left represent the NAND/AND situation.

FIG. 1c shows a micrograph of the resonator 10 and experimental setup. A network analyzer 19 is used to drive the resonator 10 at the desired frequency and amplitude, while a signal generator 22 is used to produce white noise in a 100 kHz band encompassing the resonance of resonator 10. A second signal generator 24 provides the input signal ($I_1+I_2$). Due to the nature of the actuation scheme the input signal is mixed by the resonator producing a frequency modulation. The output current is amplified by a transimpedance amplifier 18 and measured with the vector network analyzer 19 set to continuous wave (CW) time mode (measures the time dependence of the resonators amplitude and phase at the drive frequency). The beam deflection is in the 1-5 nm range.

To drive the resonator 10 in FIG. 1c, a high frequency voltage 21 of amplitude $V_D(\omega)$ is applied to one of the electrodes. This produces the in-plane motion of the beam 12, and hence the modulation of the capacitance between the beam 12 and the detection electrode (C). In the presence of a dc bias voltage applied to the beam ($V_B$=14 V), the time-dependent modulation of the capacitance results in a current $$i_{out} = \dot{x} V_B \frac{dC}{dx};$$

where x is the effective displacement of the beam. The capacitance between the beam and the electrodes can be modeled as parallel plate capacitors. Since the displacement is much smaller than the gap between the beam and electrodes, and the drive amplitude and the amplitude of the input signal are much smaller than the bias voltage, one obtains for the dynamics of the system, $$\ddot{x} + \gamma \dot{x} + \omega_0^2 x + k_3 x^3 = f_D(t) + f_{INPUT}(t)\frac{x}{g} + f_N(t). \quad (1)$$

Here, γ is the dissipation coefficient, $$\frac{\omega_0}{2\pi}$$

is the resonance frequency, $k_3$ is a nonlinear spring constant, $f_D$ is the driving force (corresponding to the drive voltage $V_D$), $f_N$ is the force due to the applied white noise, and $f_{INPUT}$ is the force due to the input. It is noteworthy that the input force term is multiplicative, which implies that this term is only observable when the frequency of the input is within the bandwidth of the resonator.

Equation 1, in the absence of noise and input, predicts the standard behavior of the resonator as a function of the drive amplitude, going from the linear to bistable regime, as shown in FIG. 1. At any given frequency in the hysteretic bistable regime, the resonator can exist in two distinct amplitude states, separated by a potential barrier. These two states can be used as a binary element. Logic operations on this binary element are accomplished by choosing the appropriate inputs to the electrostatic gates to the resonator.

The logic inputs, represented by two asynchronous square waves ($I_1$, $I_2$) of amplitude 12.5 mVpp are electrically added ($I=I_1+I_2$) and applied to the actuation electrode. The logic values 1 and 0 are represented by the high and low level of each of the inputs. When this signals are added they give rise to three different voltage levels depending on the logic value: (1,1) has a voltage of 25 mV, (1,0) and (0,1) a voltage of 0 mV, and finally (0,0) −25 mV. The two vibrational states of the resonator are defined as the two states of the single output of the logic element.

Switching between the two output states can be accomplished by a modulation signal applied to the drive. Beyond a threshold value, switching between the states can coherently follow the modulation. In the sub-threshold regime, coherent switching (in response to the modulation signal) between the states is mediated by the noise.

The points of operation of the resonator are the edges of the bistable region, as shown in FIG. 1b. When the input is applied the operation point moves, as marked by the horizontal arrows in FIG. 1b. At the operating point, controlled switching can be induced between the two states in the presence of noise.

Figure 2:
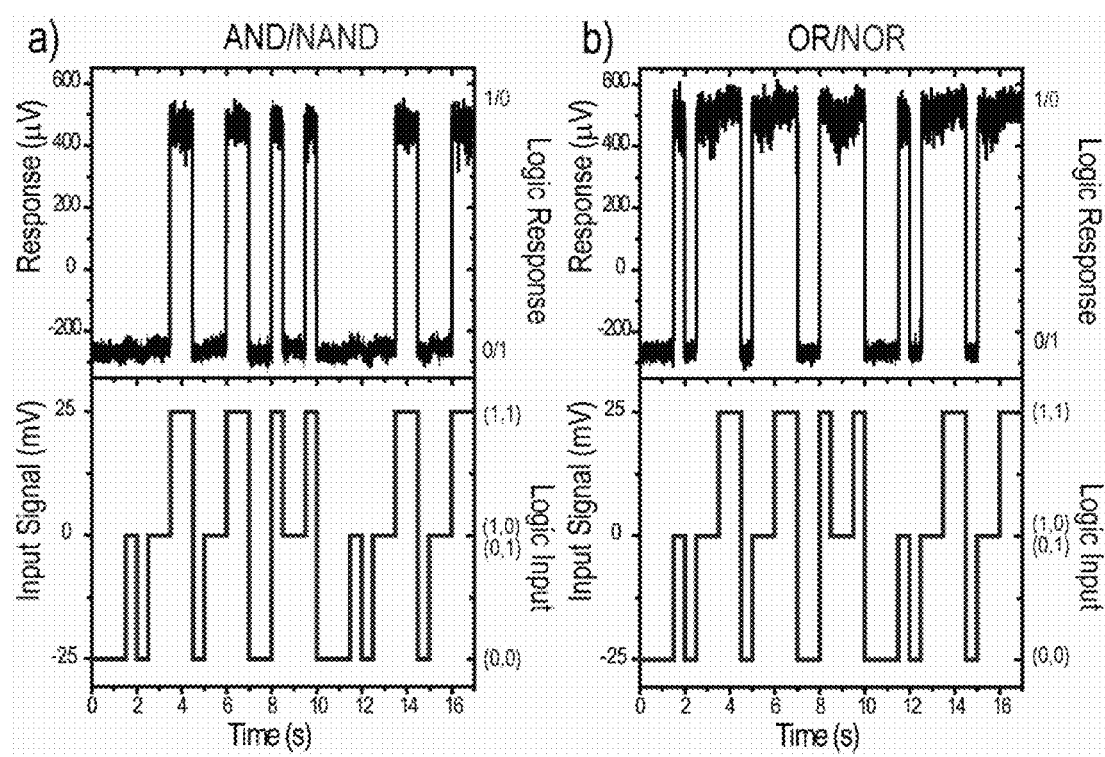

The noise-induced coherent switches are only produced when the input has the "correct" value as shown in FIG. 2; in other words, the logic function of the device (e.g. AND/OR, or NAND/NOR) is defined by choosing the "correct" input. For the AND/NAND gate (arrow 65 bottom left of FIG. 1b), the input can only produce a switch from the low level state to the high level state (logic output 1) when it has a value of 25 mV, corresponding to a logic input (1,1). For the OR/NOR gate (arrow 66 top right of FIG. 1b), the switch from the high to the low level state is only accomplished when the input value is −25 mV, logic (0,0).

FIG. 2a shows the response in quadrature of the resonator to the low frequency input (bottom) as a function of time in the presence of white noise showing AND/NAND logic. The drive frequency is 3.158 MHz and the drive amplitude is 49.3 mV with a noise power of −89 dBm. The input signal (I) is an aperiodic three state square wave with amplitude of 50 mVpp, equivalent to the electric sum of two aperiodic square waves ($I_1$ and $I_2$) with amplitudes of 25 mVpp. Top left side indicates the logic response of the resonator.

Depending on the assignment of the logical value to the vibrational states of the resonator an AND (black) gate or NAND (red) gate is obtained. Bottom left side indicates the logic values of the inputs written as ($I_1,I_2$). Note that the logic states (1,0) and (0,1) correspond to the same electrical level.

FIG. 2b shows the response in quadrature of the resonator to the low frequency input (bottom) as a function of time in the presence of white noise showing OR/NOR logic. In this case the drive frequency and noise power are the same as in FIG. 2a but the drive amplitude is 50.5 mV.

Figure 3:
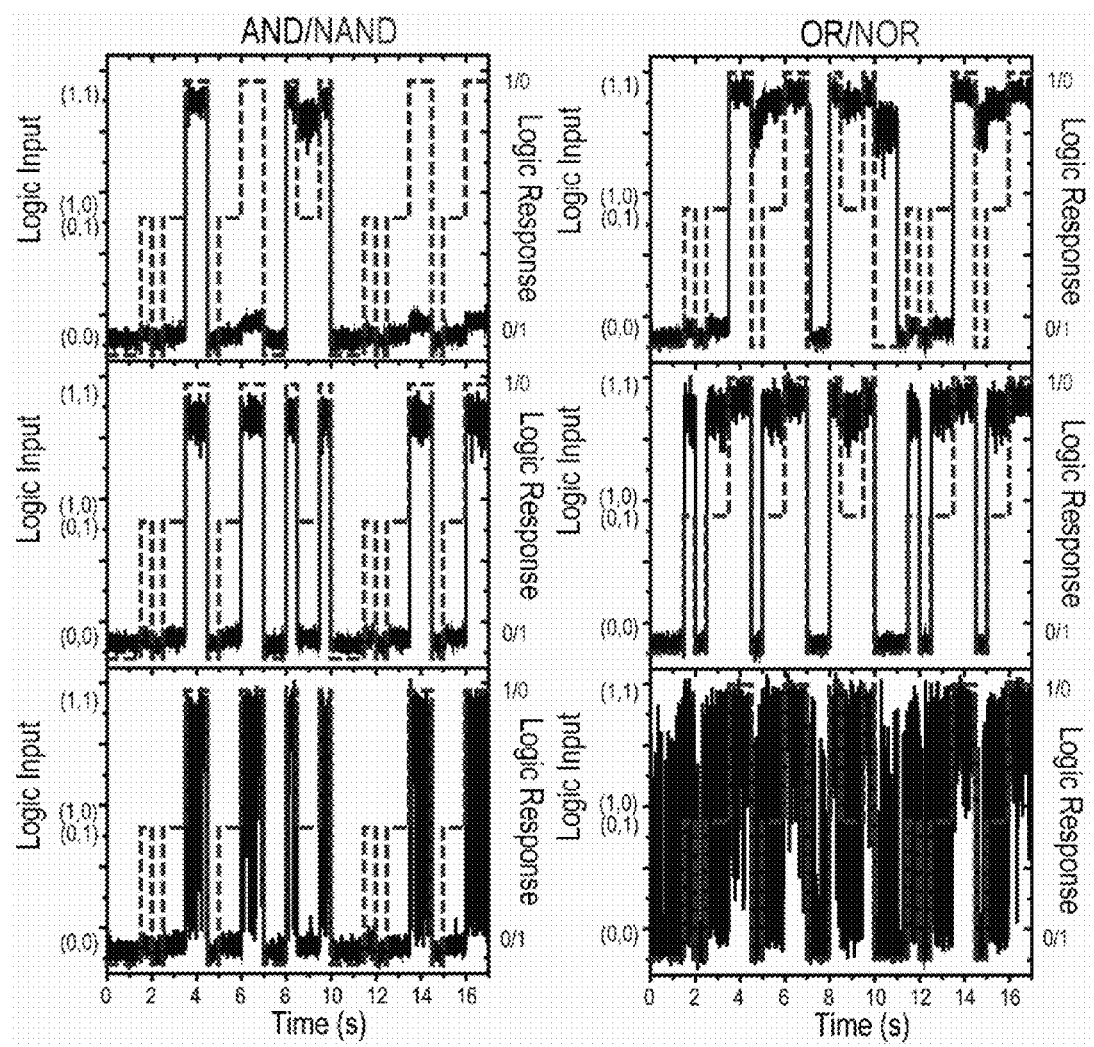
FIG. 3 shows the progression of the response of the resonator of FIG. 1a for the AND/NAND and OR/NOR functions, respectively.

In both cases, the reliable logic gate is realized for an optimal level of noise. For low noise power, switches are synchronized with the input but they are sporadic, as shown in FIG. 3 (top). As the noise power is increased, the optimal noise window is reached (FIG. 3 middle) where the output is the desired logic function of the inputs with probability equal to 1. With further increase in the noise power, random switches begin to occur, destroying any logic relation between input and output (FIG. 3 bottom). These observations can be quantified by calculating the probability of obtaining the desired logic function.

Figure 4:
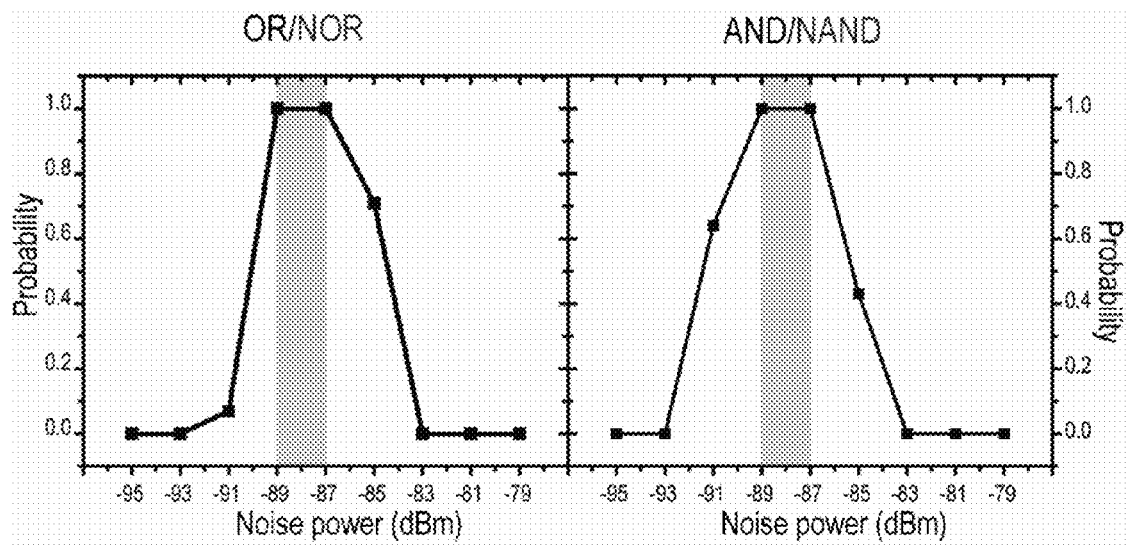
FIG. 4 shows the probability of obtaining an OR/NOR and AND/NAND logic gate as a function of noise power.

The results are shown in FIG. 4 for both the AND/NAND and OR/NOR cases. The probability is equal to one for both types of gates in the same noise window. This is a necessary condition since in a realistic application noise power may not be controlled, which makes drive amplitude and, e.g. in this experimental setup, the nonlinearity strength (governed by the natural frequency $\omega_0$ and/or the coefficient $k_3$) the only tunable parameters to reprogram logic response. We emphasize, however, that adjusting the nonlinearity is tantamount to dynamically "tuning" the internal noise-floor. The addition of a small (and controllable) dc signal to the input can also tune (in this case, asymmetrize at time t=0) the transfer characteristic and, hence, the internal noise-floor. In any case, it is not necessary (and, often, unrealistic in real applications) to directly control the system noise.

FIG. 3 shows the progression of the response of the resonator in the presence of white noise (increasing from the top). Left (right) side shows the resonator performing AND/NAND (OR/NOR) logic. For low noise power (−93 dBm) the input is not able to produce reliable transitions between the two states. As the noise is increased an optimal noise power is reached (−89 dBm) in which the resonator switches synchronously with the input, obtaining in this way a reliable logic gate. Further increase of the noise power (−82 dBm left, −79 dBm right) leads to the occurrence of random switches, destroying the reliability of the logic gates. The drive conditions for the resonator are the same as in FIG. 2.

FIG. 4 (Left) shows the probability of obtaining an OR/NOR logic gate as a function of noise power and FIG. 4 (Right) shows the probability for an AND/NAND logic gate as a function of noise power. The probability is calculated using an input signal with all the possible values, repeated 30 times (a total of 90 logic operations are performed). If the output matches the expected logic output for all possible combinations is considered a success. The probability is then calculated as the number of successes divided by the total number of attempts (in this case 30). The drive conditions for the resonator and noise level applied are the same as in the central panel of FIG. 3.

An important measure of the device performance is the energy cost of a single logic operation. This can be estimated as the change in energy stored in the system due to the applied voltage necessary to switch the state of the resonator, $E_{diss}=CV_BV_I \sim 10^{-17}$ J, where $V_I$ is the input voltage (25 mV, in this case). It is well known that the minimum energy dissipated by an irreversible logic operation is limited by the heat released due to the loss of one bit of information[17], $k_B T \ln 2$. For the present realization, the relevant noise source is the externally applied white noise[18] with $k_B T_{eff} \sim 10^{-18}$ J (corresponding to a total noise power of −88 dBm), where $T_{eff}$ is the effective temperature of the applied noise.

This results in a dissipated energy very close to the Landauer's limit $E_{diss} \sim 10 k_B T_{eff}$. It is important to note that $T_{eff} \approx 10^3$ T at room temperature. The power needed for the operation of this prototype reprogrammable logic gate is ~0.1 nW in the low level state and ~0.3 nW in the high level state. We estimate it to be $V_D \cdot i_{out}$, where $V_D$ is the drive amplitude and $i_{out}$ is the current produced by the resonator before amplification. Minimum required power can be reduced by orders of magnitude in the next generation of devices by optimizing the device geometry and actuation mechanisms.

The speed of operation is governed by the noise induced switching rate, $\Gamma$. In this case the measured rise and fall time are 0.2 ms (the rise and fall time for the input is of the order of ns). This is in good agreement with previously measured transition rates in similar devices. The transition rate is given by $$\Gamma \approx \frac{\omega_0}{2\pi Q} e^{\frac{-E_A}{k_B T_{eff}}}$$

with $E_A \propto (\omega-\omega_c)^2$, where $\omega$ is the drive frequency and $\omega_c$ is the critical frequency (frequency at which the bifurcation takes place for a given drive amplitude). Hence, there are many ways of improving the operation speed—i.e. by increasing the resonance frequency of the resonator, increasing the noise power or simply changing the drive frequency.

The realization of nanomechanical logic gates with power consumption and size competitive with the current CMOS logic gates is exciting. Not only does it enable a path towards an alternative architecture beyond the limit to which current microprocessors can be scaled, it also provides a fundamental building block for alternate computing schemes apart from the straightforward swap-in with the conventional logic gates. For instance, (stochastic) noise-assisted nanomechanical logic elements can be used for direct and controlled computing to harness nonlinearity and exploit inherent parallelism. Such approaches have already been shown to result in highly desirable architectures using flexible parallel implementations of chaotic logic gates. It merits comment that, in this work, we appear to have achieved a fusion of both Babbage's and Boole's visions with today's nanotechnology.

Nanomechanical logic elements described here are three-dimensional structures, which enable local inputs, outputs and controls. Furthermore, due to the geometrical flexibility, it is possible to include additional constraints such as symmetry in inputs and outputs towards the realization of elements for reversible computation such as Feynman's billiard ball logic or the Fredkin-Toffoli gate. An even more fascinating possibility arises when the nanomechanical resonator is operated in a regime of high frequency and low temperature so that its energy levels are quantized, with the two-level structure corresponding, now, to two quantized energy states. While the system discussed in this work was not operated in this limit there has, already, been speculation regarding the potential applicability of the "stochastic resonance" effect to quantum measurement and control scenarios.

Although the noise-assisted reprogrammable nanomechanical logic gates and related methods herein have been described with reference to specific embodiments, various changes may be made without departing from the spirit or scope of the present disclosure. Accordingly, the disclosure of embodiments herein is intended to be illustrative of the scope of the invention and is not intended to be limiting. It is intended that the scope of this application shall be limited only to the extent required by the appended claims. The noise-assisted reprogrammable nanomechanical logic gates and related methods discussed herein may be implemented in a variety of embodiments, and the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A nanomechanical logic device comprising:
   a nanomechanical resonator operating in a nonlinear frequency regime having two different vibrational steady states;
   first bias means applied to the resonator for inducing the two vibrational steady states with a controllable drive signal thereby creating the two vibrational steady states representing different logic states having a logic value as an output;
   second bias means for applying noise to the resonator; and
   logic signal input bias means applied to the resonator for producing a modulation of the nonlinear frequency regime which, with the presence of the noise, induces switching between the two vibrational steady states and changing the logic value of the output.

2. The logic device of claim 1, wherein a general logic function defined by a set of inputs and a set of outputs comprises at least one of:
   an AND function; an OR function; a NAND function; or a NOR function.

3. The logic device of claim 2, wherein the logic function is dynamically programmable for the logic device.

* * * * *